US006584133B1

United States Patent
Walker et al.

(10) Patent No.: US 6,584,133 B1
(45) Date of Patent: Jun. 24, 2003

(54) FREQUENCY-NARROWED HIGH POWER DIODE LASER ARRAY METHOD AND SYSTEM

(75) Inventors: Thad G. Walker, Madison, WI (US); Bien Chann, Madison, WI (US); Ian A. Nelson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 260 days.

(21) Appl. No.: 09/706,596

(22) Filed: Nov. 3, 2000

(51) Int. Cl.$^7$ ................................................. H01S 3/08
(52) U.S. Cl. .......................... 372/92; 372/98; 372/99; 372/101; 372/102; 372/108; 372/27
(58) Field of Search ..................... 372/98, 99, 100–102, 372/108, 27, 92

(56) References Cited

U.S. PATENT DOCUMENTS

| | | | |
|---|---|---|---|
| 5,206,878 A | 4/1993 | Sizer, II | |
| 5,289,485 A | 2/1994 | Mooradian | |
| 5,319,668 A | 6/1994 | Luecke | |
| 5,327,447 A | 7/1994 | Mooradian | |
| 5,337,328 A | 8/1994 | Lang et al. | |
| 5,386,426 A | 1/1995 | Stephens | |
| 5,524,012 A | 6/1996 | Wang et al. | |
| 5,572,542 A | 11/1996 | Dixon | |
| 5,594,744 A | 1/1997 | LeFevre et al. | |
| 5,636,059 A | 6/1997 | Snyder | |
| 5,651,018 A | * 7/1997 | 'Mehuys et al. | ............... 372/99 |
| 5,734,672 A | 3/1998 | McMinn et al. | |
| 5,771,252 A | 6/1998 | Lang et al. | |
| 5,860,295 A | 1/1999 | Cates, Jr. et al. | |
| 5,913,108 A | 6/1999 | Stephens et al. | |
| 6,038,239 A | * 3/2000 | Gabbert | ...................... 372/101 |

FOREIGN PATENT DOCUMENTS

| | | |
|---|---|---|
| EP | 0921614 | 3/2001 |
| WO | WO 96 33536 A | 10/1996 |

OTHER PUBLICATIONS

Martin Lobel, et al., "Tunable single–mode operation of a high–power laser–diode array by use of an external cavity with a grating and photorefractive phase–conjugate mirror," J. Opt. Soc. Am. B, vol. 15, No. 7, Jul. 1998, pp. 2000–2005.
Hiroyuki Asakura, et al., "External cavity semiconductor laser with a Fourier grating and an aspheric lens," Applied Optics, vol. 32, No. 12, Apr. 20, 1993, pp. 2031–2038.

(List continued on next page.)

*Primary Examiner*—Leon Scott, Jr.
(74) *Attorney, Agent, or Firm*—Foley & Lardner

(57) ABSTRACT

A high power diode laser array system utilizes an external cavity to narrow the spectral width of a high power diode laser array to change the output power normally produced by the diode array from a broad spectrum to a very narrow spectrum. The power output of the laser array system is concentrated over a narrow spectral range which falls within the useable range for particular applications such as optical pumping of noble gas samples for magnetic resonance imaging. The output of the array is received by a collimating element, which collimates the light in a direction perpendicular to the direction of the length of the array of emitters and directs the light on a beam path to a diffraction grating which is oriented at an angle to the incident beam. A portion of the beam is directed from the diffraction grating to provide useable output light, and a portion of the light incident on the grating is directed back to be focused on the diode array to provide feedback to cause the diode array to preferentially lase at the wavelength of the light that is fed back. A polarization rotation element may be used to orient the polarization of the light passing through it to control the amount of feedback light.

36 Claims, 4 Drawing Sheets

OTHER PUBLICATIONS

R. J. Jones, et al., "Near–diffraction–limited high power (~1 W) single longitudinal mode CW diode laser tunable from 960 to 980 nm," IEE, Aug. 9, 1995.

P. Gavrllovič, et al., "High–power grating tuned semiconductor diode lasers and single–frequency diode–pumped Nd:YAG microcavity lasers," Joint Soviet–American Workshop on the Physics of Semiconductor Lasers, May 20–Jun. 3, 1991, pp. 37–48.

Haim Lotem, et al., "Tunable external cavity diode laser that incorporates a polarization half–wave plate," Applied Optics, vol. 31, No. 36, Dec. 20, 1992, pp. 7530–7532.

T. Earles, et al., "Narrow spectral width (< Å FWHM), 1.1–W cw operation from 100–$\mu$m stripe DFB diode lasers ($\gamma$=0.893 $\mu$m) with Al–free optical–confinement region," CLEO 1998, Monday Morning, pp. 38–39.

Gabriele Ferrari, et al., "High–power multiple–frequency narrow–linewidth laser source based on a semiconductor tapered amplifier," Optics Letters, vol. 24, No. 3, Feb. 1, 1999, pp. 151–153.

Mats Hagberg, et al., "5–W 930–nm tunable external–cavity laser," CLEO 1998, Monday Morning, pp. 40–41.

Haim Lotem, et al., "Tunable dual–wavelength continuous–wave diode laser operated at 830 nm," Applied Optics, vol. 32, No. 27, Sep. 20, 1993, pp. 5270–5273.

Michael G. Littman, et al., "Spectrally Narrow Pulsed Dye Laser Without Beam Expander," Applied Optics, vol. 17, No. 14, Jul. 15, 1978, pp. 2224–2227.

W.F. Sharfin, et al., "High–Power, Diffraction–Limited, Narrow–Band, External–Cavity Diode Laser," App. Phys. Lett., vol. 54, No. 18, May 1, 1989, pp. 1731–1733.

Carl E. Wieman, et al., "Using Diode Lasers for Atomic Physics," Rev. Sci. Instrum., vol. 62, No. 1, Jan., 1991, pp. 1–20.

Chi–Luen Wang, et al., "Tunable Dual–Wavelength Operation of a Diode Array with an External Grating–Loaded Cavity," Appl. Phys. Lett., vol. 64, No. 23, Jun. 6, 1994, pp. 3089–3091.

E.R. Brown, et al., "Miliwatt Output Levels and Superquadratic Bias Dependence in a Low–Temperature–Grown GaAs Photomixer," Appl. Phys. Lett., vol. 64, No. 24, Jun. 13, 1994, pp. 3311–3313.

Thad G. Walker, et al., "Spin–Exchange Optical Pumping of a Noble–Gas Nuclei," Rev. of Modern Physics, vol. 69, No. 2, Apr. 1997, pp. 629–642.

A.K. Goyal, et al., "Stable Single–Frequency Operation of a High–Power External Cavity Tapered Diode Laser at 780 nm," Appl. Phys. Lett., vol. 71, No. 10, Sep. 8, 1997, pp. 1296–1298.

A. Ben–Amar Baranga, et al., "Polarization of 3He by Spin Exchange with Optically Pumped Rb and K Vapors," Physical Review Letters, vol. 80, No. 13, Mar. 30, 1998, pp. 2801–2804.

Ming–Wei Pan, et al., "Fiber–Coupled High–Power External–Cavity Semiconductor Lasers for Real–Time Raman Sensing," Applied Optics, vol. 37, No. 24, Aug. 20, 1998, pp. 5755–5799.

Ming–Wei Pan, et al., "Spatial and Temporal Coherence of Broad–Area Lasers with Grating Feedback," J. Opt. Soc. Am. B, vol. 15, No. 10, Oct., 1998, pp. 2531–2536.

Torkild Eriksen, et al., "Rocketborne Rayleigh Lidar for in situ Measurements of Neutral Atmospheric Density," Applied Optics, vol. 38, No. 12, Apr. 10, 1999, pp. 2605–2613.

L. Hsu, et al., "Frequency Tracking and Stabilization of a Tunable–Dual–Wavelength External–Cavity Diode Laser," Optics Communications, vol. 168, Sep. 1, 1999, pp. 195–200.

V. Daneu, et al., "Spectral Beam Combining of a Broad–Stripe Diode Laser Array in an External Cavity," Optics Letters, vol. 25, No. 6, Mar. 15, 2000, pp. 405–407.

Industrial Microphotonics Company, 808 nm 20W CW Laser Diode Array, Part No.: ARR26C020, specification sheet, 2000.

D. Wandt, et al., "External cavity laser diode with 40 nm continuous tuning range around 825 nm, " Optics Communications, vol. 130, Sep. 15, 1996, pp. 81–84.

* cited by examiner

FREQUENCY-NARROWED HIGH POWER DIODE LASER ARRAY METHOD AND SYSTEM

REFERENCE TO GOVERNMENT RIGHTS

This invention was made with United States government support awarded by the following agency: NSF 9724172. The United States government has certain rights in this invention.

FIELD OF THE INVENTION

This invention pertains generally to the field of high power diode laser arrays.

BACKGROUND OF THE INVENTION

High power diode laser arrays are now in use for a variety of technological applications. Commercially available diode array systems with high output power (greater than 1 watt) are currently relatively expensive. Although the cost of such systems is likely to decrease over time, a typical current cost for a 15 watt diode array is in the range of $25,000. Clearly, the users of such arrays wish to have as much usable laser light as possible. Unfortunately, much of the light that is emitted is not usable for many applications.

One important use of high power diode lasers is for producing laser polarized noble gases for medical magnetic resonance imaging (MRI). As an example, a 15 watt laser array can be used to optically pump the noble gas sample. The user tunes the array to a wavelength at which the gas in the cell is activated, e.g., 795 nanometers where rubidium is used. Unfortunately, like all high power diode laser systems now available, the laser not only puts out laser light at the desired 795 nm, but also a spread of wavelengths around 795 nm. While the peak of the spectrum may be at 795 nm, the 15 watts of output power is typically spread over several nanometers, typically displaying a Gaussian-type curve of laser power versus wavelength centered at the desired wavelength. Thus, only a fraction of the 15 watts of output power is usable by the cell. Under reasonably attainable conditions, generally only the light which is between about 794.9 and 795.1 nanometers is useful. The vast majority of the output power of the laser is outside this range and is wasted; typically of the 15 watts of power produced by the laser system, only 1 or 2 watts may fall within the useful range.

SUMMARY OF THE INVENTION

In accordance with the present invention, a high power diode laser array system utilizes an external cavity to narrow the spectral width of a high power diode laser array to change the output power normally produced by the laser array from a broad spectrum to a very narrow spectrum, so that more power is concentrated over a narrow spectral range which falls within the usable range for a particular application, such as optical pumping of noble gas samples for MRI. The total power output of the laser system is reduced a moderate amount from the output power provided from the laser array alone, but is concentrated within a narrow spectral range to provide a much higher equivalent power laser system.

The high power diode laser array system in accordance with the present invention includes a high power diode laser array comprising multiple laser diode emitters arranged in approximately a straight line. A cylindrical collimating element is positioned to receive the output of the laser diode array and provide an output beam that is collimated in a direction perpendicular to a direction along the length of the array of emitters. A diffraction grating is mounted to receive the collimated beam from the collimating element on a beam path. The diffraction grating may be arranged in a Littrow cavity configuration, oriented at an angle to the incident beam such that a portion of the light in the beam incident on the grating is directed back on the beam path to the collimating element and is focused on the array of laser diode emitters to provide feedback thereto to narrow the spectral range of the laser light output. A portion of the beam may be directed by the diffraction grating to provide a useable output light beam from the laser system or otherwise directed out of the cavity. The diffraction grating may also be arranged in a Littman-Metcalf cavity configuration; with the light directed from the grating to a mirror and back to the grating to form the light fed back to the array. A magnifying system formed of optical elements receives the beam from the cylindrical collimating element and images the emitters of the array in the long dimension of the array that is along the length of the array onto the diffraction grating or the mirror in a Littman-Metcalf configuration, with a selected magnification factor, the grating having grooves which are aligned parallel to the long dimension of the array of emitters. The cylindrical collimating element may comprise, for example, a cylindrical lens. The magnifying system is preferably formed of lenses arranged as a telescope with a selected magnification factor. A polarization rotation element may be mounted in the beam path from the collimating element to the diffraction grating. The polarization rotation element is oriented such that the light on the beam path passed therethrough to the diffraction grating is oriented with respect to the diffraction grating to provide a selected efficiency of the diffraction grating and to select the amount of light directed back by the diffraction grating toward the laser diode array to provide effective feedback without damaging the laser diode array. The polarization rotation element (e.g., a half wave plate) can be mounted for rotation about an axis parallel to the output beam from the collimating element to allow rotation of the polarization rotation element to select the amount of feedback to the laser diode.

Further objects, features and advantages of the invention will be apparent from the following detailed description when taken in conjunction with the accompanying drawings.

DETAILED DESCRIPTION OF THE INVENTION

The present invention may be utilized to frequency narrow and tune commercial diode laser arrays. The external cavity diode laser array (ECDLA) systems of the invention are well suited to various applications including laser polarization of noble gases for medical magnetic resonance imaging.

Figure 5:
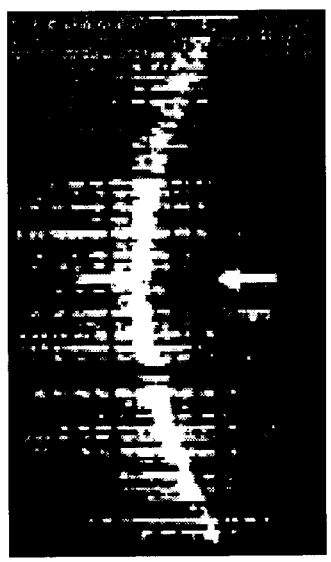
FIG. 5 is an image of emitters in a laser array having approximately 9 µm of "smile."
Figure 6:
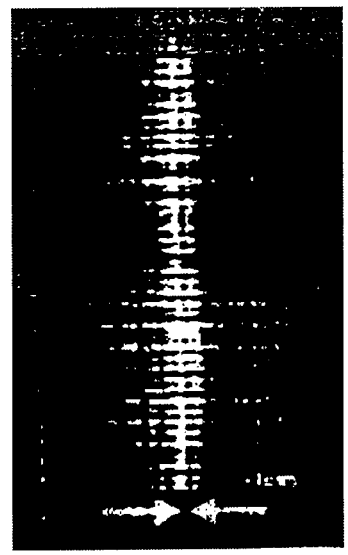
FIG. 6 is an image of emitters in a laser array having approximately 1 µm of "smile."

A diode array comprises multiple laser diode emitters arranged with the output apertures in approximately a straight line. The light from the elements has a typical diffraction-limited 40° divergence angle in the direction perpendicular to a direction along the length of the array, and 10° multi-mode divergence angle in the direction parallel to the array, with substantial astigmatism. The principle difficulty in using an external cavity to frequency-narrow arrays is the large etendue (area x solid angle) of the array. In accordance with the invention, light from each emitter is appropriately collimated, reflected off a diffraction grating, and imaged back onto the emitter, preferably with high efficiency. Spectral narrowing is complicated by a small curvature of the "linear" array ("smile") produced in the manufacturing process. The array elements are typically offset by 3–10 $\mu$m over the 1 cm length of the array. For illustration, FIG. 5 shows an image of emitters in an array having about 9 $\mu$m of "smile" and FIG. 6 shows an array having about 1 $\mu$m of "smile." Compensation for smile is accomplished in accordance with the invention for enhanced performance.

Figure 1:
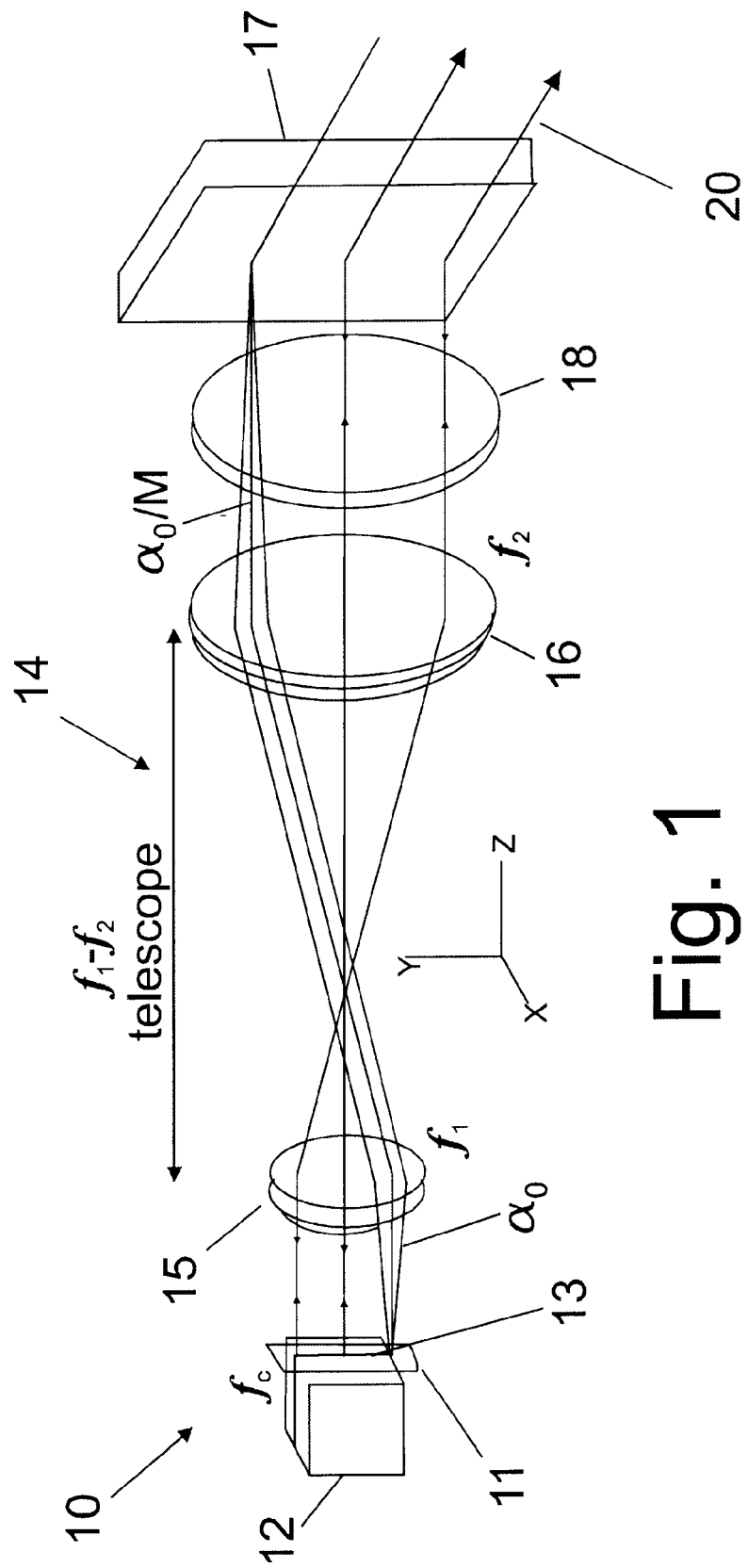
FIG. 1 is a schematic diagram of a frequency narrowed high power diode laser array system in accordance with the invention.

As shown in FIG. 1, an exemplary frequency narrowed laser diode array system 10 in accordance with the invention uses a fast cylindrical lens 11 as a cylindrical optical element to collimate the rapidly diverging light from a laser diode array 12 along the $\hat{x}$ direction, that is, the direction perpendicular to the direction along the length of the array of emitters 13. Following the cylindrical lens, an afocal magnifying system (telescope) 14 formed of optical elements, e.g., lenses 15 and 16, receives the beam of light from the cylindrical lens and images the emitters along the $\hat{y}$-dimension of the array system (the dimension parallel to the array) onto a grating 17 with magnification M, while expanding the collimated light also by a selected factor M. The grating, in Littrow mount with grooves parallel to $\hat{y}$, provides feedback to the laser gain elements. A polarization rotation element 18 (e.g., a half wave plate) may be mounted in the cavity to allow adjustment of the feedback to the array. The element 18 is preferably mounted for rotation about an axis parallel with the output beam, e.g., with a conventional rotational mount used for lenses and other optical elements. A preferred polarization rotation element is a half wave plate.

For light striking the grating with direction $\hat{z} \cos \alpha \cos \phi + \hat{y} \sin \alpha + \hat{x} \sin \alpha \sin \phi$ with respect to the optical axis, the Littrow feedback condition is $$\lambda = 2d \sin(\theta - \phi) \cos \alpha$$

or $$\delta\lambda/\lambda_0 \sim -\alpha^2 - \phi \cot \theta \qquad (1)$$

where $\lambda_0 = 2d \sin \theta$, $\theta$ is the angle between the optical axis and the grating normal, $\delta\lambda = \lambda - \lambda_0$, and the angles $\alpha$ and $\phi$ are assumed small. Thus, spreads in $\alpha$ (from the divergence of the light emitted from the laser) and $\phi$ (from smile) both result in broadening of the laser spectrum.

The magnifying system comprising a telescope 14 formed of the elements 15 and 16 reduces the angular spread in the $\hat{y}$-direction from $\alpha_0$, at the laser to $\alpha = \alpha_0/M$ at the grating. From Eq. 1, this reduces the broadening by a actor of $M^2$. More importantly, the afocal nature of the telescope means that the angular spread of rays at the grating from off-axis elements is symmetrically entered around zero. If imaging methods with finite focal length lens systems are used, it is difficult to reduce the linewidth below 150 GHz.

The telescope 14 also reduces the spread in angles resulting from smile to $\phi = x/Mf_c$, where x represents the amount of smile. The resulting laser linewidth due to smile is $$\frac{\delta\lambda}{\lambda} = \frac{x \cot \theta}{Mf_c} \qquad (2)$$

Thus, to minimize the contribution of smile to the linewidth, it is desirable to use a cylindrical lens with a long $f_c$, a large magnification for the magnifying system, and large diffraction angle.

For one example of an ECDLA in accordance with the invention, a commercial 20 W, 1 cm long, 46 element diode laser array at 801 nm with a 670 GHz bandwidth was used. The array was selected by the manufacturer to have smile<1 $\mu$m. For intracavity lenses, a $f_c=0.73$ mm cylindrical meniscus lens 13 with a ×4 telescope (m=4) 14 made from a 50 mm, f/2 lens and a 200 mm, f/4 lens were used. Both achromats and singlet lenses gave similar results, suggesting that aberrations are not a serious problem. A 2400 lines/mm, 2" holographic diffraction grating 17 was used which had a Littrow angle $\theta=72°$ at 800 nm. The grating was mounted on a rotatable stage to allow the grating grooves to be exactly parallel to the orientation of the array. To optimize the feedback, included in the cavity was a half-wave plate 18 to exploit the polarization sensitivity of the grating. With these parameters, the smile contribution to the linewidth from Eq. 2 is 40 GHz.

Figure 2:
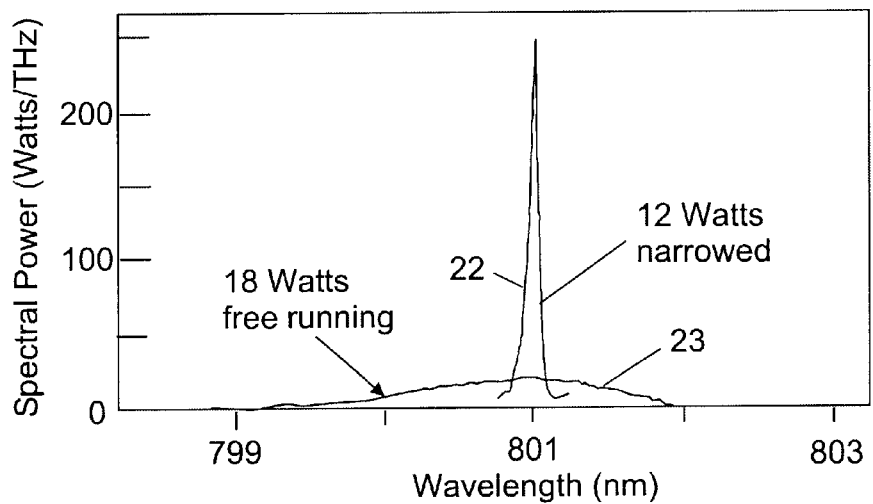
FIG. 2 is a diagram illustrating measured power spectra for the narrowed diode array system of FIG. 1 and for an unnarrowed diode array.

The linewidth of the output beam 20 was measured using a parallel-plate Fabry-Perot cavity of finesse of about twenty, and as shown in FIG. 2 is approximately 50 GHz. Since the lineshape is not well-characterized by a Gaussian, the linewidth is taken as the frequency window that contains 64% of the power. To be safely below damage thresholds, the intracavity power was limited to less than the specified 20 W maximum of the diode array, corresponding to a free-running power out of the array of 18 W. With careful small adjustments of the lenses about their design positions, and adjustment of the half wave-plate 16, typically 12.2 W out with a 60 GHz linewidth is obtained. Best results showed a 47 GHz linewidth with corresponding spectral power of 250 W/THz. As shown in FIG. 2, the spectral power 22 of the system of the invention at 801 nm is approximately a factor of 10 greater than the spectral power 23 of the free-running array. Three-lens telescopes 14 that give shorter cavities were also used, and resulted in similar performance.

Figure 3:
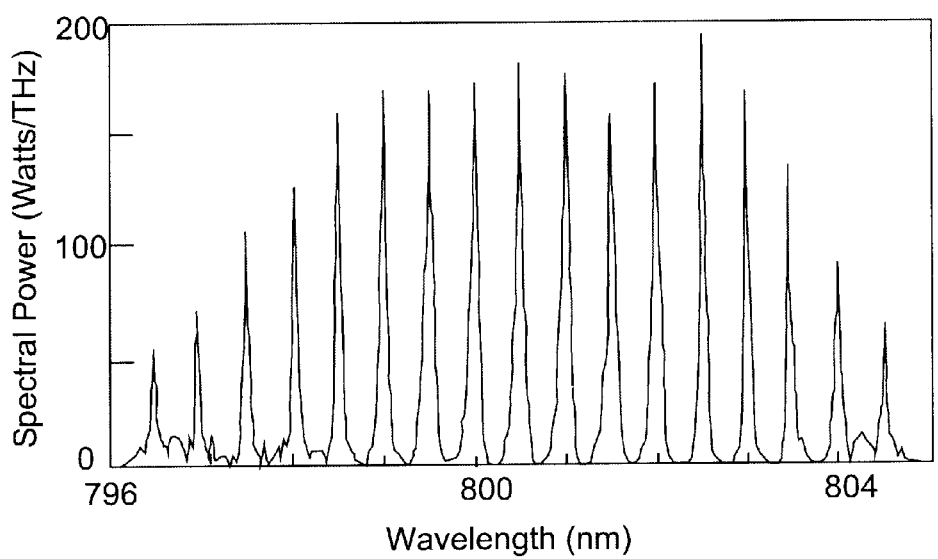
FIG. 3 is a diagram showing tuning range and output power of the narrowed portion of the external cavity laser array spectrum.

Tunability of the center laser frequency is also of interest for applications, such as spin-exchange optical pumping, that require precise frequencies. Typically, temperature tuning can be used to provide 2–3 nm of tuning. The added tunability of the external cavity design of the invention allows a larger tolerance of the free running laser wavelength for applications requiring a specific wavelength. FIG. 3 shows the tuning range of the laser array discussed above. As the laser array was detuned by more than about 1 nm from its free-running central frequency, the fraction of the spectrum in the narrowed peak decreased, resulting in reduced narrowed power.

As expected, the linewidth increases for arrays with large amounts of smile. Using a longer focal length (3.35 mm)

cylindrical lens, a 120 GHz bandwidth was obtained for an array with 10 μm of smile. Using an array with 3 μm of smile, it was found that the central peak of the frequency spectrum was about 60 GHz, but only about 85% of the light was in the central peak.

Figure 4:
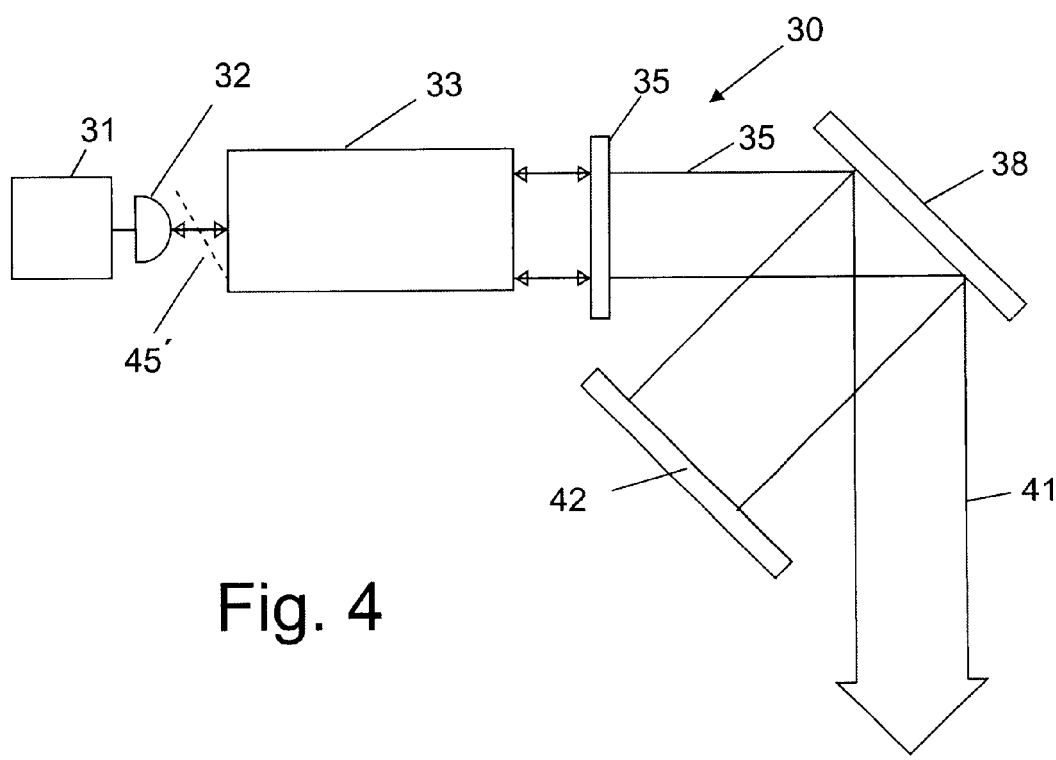
FIG. 4 is a schematic diagram of a frequency narrowed high power diode laser array system in accordance with the invention having a Littman-Metcalf cavity configuration.

The invention may also be embodied in an ECDLA with a Littman-Metcalf external cavity, as illustrated in FIG. 4. The laser system 30 of FIG. 4 has a laser diode array 31, a fast cylindrical lens 32, a magnifying telescope 33, and, if desired, a half wave plate or other polarization rotation element 35. These elements may be selected as discussed above for the system 10 of FIG. 1. The beam 36 from the telescope optics 33 is incident upon a grating 38 which directs light to a mirror 40 that faces the grating and reflects the light back to the grating 38. Part of the light exits in an output beam 41 and part is directed back along the path of the beam 36 to be focused onto the emitters of the diode array 31 to provide feedback thereto. As an example of this configuration, a 1200 lines/mm blazed grating 38 was used with performance similar to the Littrow case, excepting a typical 20% loss in power. Different grating selection may be used to improve the performance up to the level of the Littrow cavity. It is noted that the image in a Littman-Metcalf cavity is on the mirror 40 instead of on the grating 38.

Figure 7:
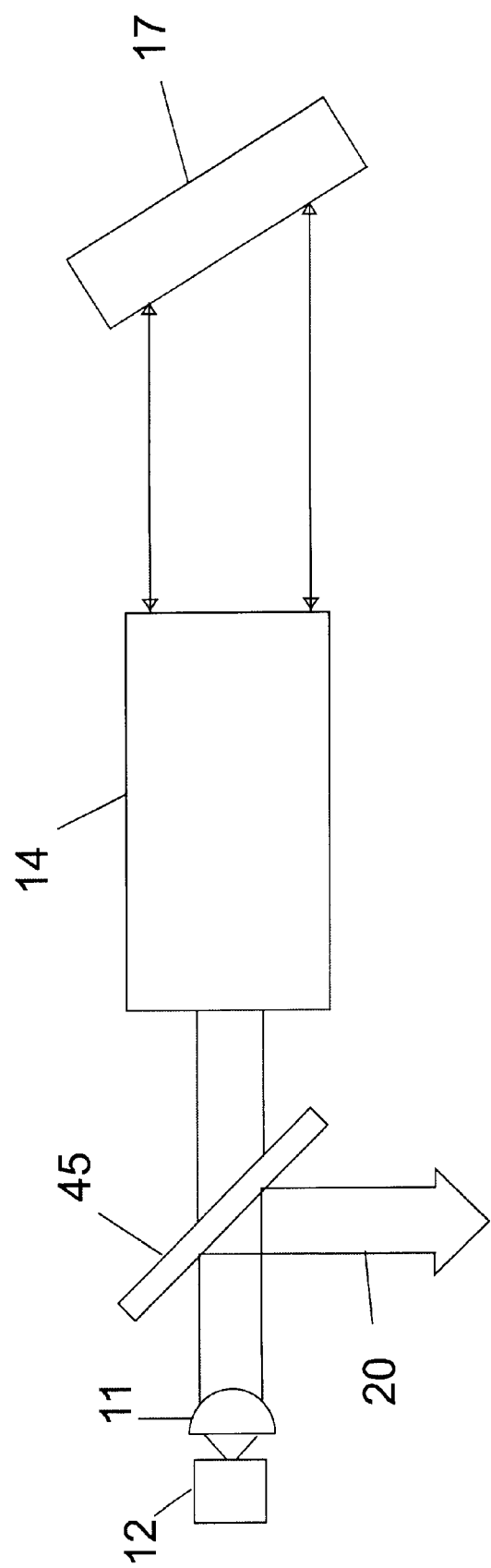
FIG. 7 is a schematic diagram of a frequency narrowed high power diode array system in accordance with the invention similar to that of FIG. 1 but with the output beam directed out of the cavity by a beam splitter.

It is noted that the output beam from the system can be directed out of the cavity other than by the diffraction grating. As an example, FIG. 7 shows a Littrow type cavity system similar to FIG. 1 (with the same parts bearing the same numerals). A beam splitter 45, preferably non-polarizing, is mounted in the beam path between the cylindrical lens 11 and the grating 17 to partially reflect the light from the laser array 12 into an output beam 20 that exits the cavity. The beam splitter 45 also partially transmits the laser light to pass through the optics 14 to the grating 17 and thence back again through the beam splitter 45 to be focused on the emitters 13 of the laser array 12. Similarly, a beam splitter may be inserted in the beam between the lens 32 and grating 38 of the Littman-Metcalf configuration of FIG. 4 to form the output beam, as illustrated at 45' in FIG. 4.

The ECDLA can be extended to stacks of diode array bars, such as are currently used to provide in excess of 100 W. In that case, each array in the stack will require its own cylindrical lens 11. The linewidth generally will be sensitive to the degree of smile present in the individual bars, as well as to the alignment of the bars, but using the principles of the present invention, system capabilities in excess of 75 W with less than 100 GHz bandwidth can be expected. Such a source is well-matched to the needs of spin-exchange optical pumping of noble gases, e.g., xenon, helium, mixtures of xenon and rubidium, mixtures of helium and rubidium, mixtures of cesium and xenon, and mixtures of potassium and helium. Using measured photon efficiencies, such systems can be expected to generate in excess of 0.05 moles/hr of spin-polarized Xe or He using Rb as the spin-transfer partner, or potentially ten times greater for K—He spin exchange.

It is understood that the foregoing description is for purposes of exemplifying the invention and that modifications of these embodiments may be made without deviating from the scope of the present invention, which is set forth in the accompanying claims.

What is claimed is:

1. A high power diode laser array system having narrow spectral width output comprising:

(a) a high power diode laser array comprising multiple laser diode emitters arranged in approximately a straight line;

(b) a cylindrical collimating element positioned to receive the output of the laser diode array and provide an output beam that is collimated in a direction perpendicular to a direction along the length of the array of emitters;

(c) a diffraction grating mounted to receive the collimated beam from the collimating element on a beam path, the diffraction grating oriented at an angle to the incident beam such that a portion of the light in the beam incident on the grating is directed back on the beam path to the collimating element and is focused on the array of laser diode emitters to provide feedback thereto to narrow the spectral range of the laser light output; and (d) a magnifying system formed of optical elements that receives the beam from the cylindrical collimating element and images the emitters of the array in the long dimension of the array that is along the length of the array onto the diffraction grating with a selected magnification factor, the grating having grooves which are aligned parallel to the long dimension of the array of emitters.

2. The laser system of claim 1 wherein the cylindrical collimating element is a cylindrical lens.

3. The laser system of claim 1 wherein the magnifying system is formed of lenses arranged as an afocal telescope with a selected magnification factor.

4. The laser system of claim 3 wherein the magnification factor is equal to about four.

5. The laser system of claim 1 further including a polarization rotation element in the beam path from the collimating element to the diffraction grating, the polarization rotation element oriented such that the light on the beam path passed there-through to the diffraction grating is oriented with respect to the diffraction grating to provide a selected efficiency of the diffraction grating and to select the amount of light directed back by the diffraction grating toward the laser diode array to provide effective feedback without damaging the laser diode array.

6. The laser system of claim 5 wherein the polarization rotation element is mounted for rotation about an axis parallel with the output beam from the collimating element to allow rotation of the polarization rotation element to select the amount of feedback to the laser diode.

7. The laser system of claim 6 wherein the polarization rotation element is a half wave plate.

8. The laser system of claim 5 wherein the polarization rotation element is a half wave plate.

9. The laser system of claim 1 wherein a portion of the beam incident on the diffraction grating is directed by the diffraction grating to provide a useable output light beam from the laser system.

10. The laser system of claim 1 including a beam splitter in the beam path between the collimating element and the diffraction grating, the beam splitter partially reflecting the light from the array to provide a useable output beam from the system and partially passing the light therethrough to the diffraction grating and thence back again to be focussed onto the emitters in the diode laser array.

11. A method of narrowing the spectral width of the output of a high power diode laser array comprising multiple laser diode emitters arranged in approximately a straight line, comprising:

(a) receiving the output of the diode laser array with a collimating element to provide a collimated output beam wherein the light is collimated in a direction perpendicular to the direction of the length of the array of emitters;

(b) directing the collimated output beam to a diffraction grating mounted to receive the collimated beam from the collimating element on a beam path, and magnifying the collimated light in the output beam from the collimating element and imaging the dimension of the array along the length of the array onto the diffraction grating, and directing a portion of the beam from the grating back on the beam path to the collimating element and focusing the beam on the laser diode array emitters to provide feedback thereto to narrow the spectral range of the laser light output.

12. The method of claim 11 further including selecting the amount of light directed back by the diffraction grating to the laser diode array emitters to provide effective feedback without damaging the laser diode by passing the light on the beam path through a polarization rotation element.

13. The method of claim 12 further including rotating the polarization rotation element about an axis parallel with the beam from the collimating element to select the amount of feedback to the laser diode array emitters.

14. The method of claim 13 wherein the polarization rotation element through which the light is passed is a half wave plate.

15. The method of claim 11 further including the step of passing the output light beam from the diffraction grating into a cell containing a gas sample to laser polarize the gas.

16. The method of claim 15 wherein the gas is selected from the group consisting of xenon, helium, mixtures of xenon and rubidium, mixtures of helium and rubidium, mixtures of cesium and xenon, and mixtures of potassium and helium.

17. The method of claim 11 wherein the step of magnifying the light in the collimated output beam includes passing the beam through an afocal magnifying system.

18. The method of claim 11 including directing a portion of the beam from the diffraction grating to provide a useable output light beam.

19. A high power diode laser array system having narrow spectral width output comprising:
   (a) a high power diode laser array comprising multiple laser diode emitters arranged in approximately a straight line;
   (b) a cylindrical collimating element positioned to receive the output of the laser diode array and provide an output beam that is collimated in a direction perpendicular to a direction along the length of the array of emitters;
   (c) a diffraction grating mounted to receive the collimated beam from the collimating element on a beam path and a mirror facing the grating, the diffraction grating oriented at an angle to the incident beam such that the light is directed from the grating to the mirror and back and a portion of the light is directed back on the beam path to the collimating element and is focused on the array of laser diode emitters to provide feedback thereto to narrow the spectral range of the laser light output; and
   (d) a magnifying system formed of optical elements that receives the beam from the cylindrical collimating element and images the emitters of the array in the long dimension of the array that is along the length of the array onto the mirror with a selected magnification factor, the grating having grooves which are aligned parallel to the long dimension of the array of emitters.

20. The laser system of claim 19 wherein the cylindrical collimating element is a cylindrical lens.

21. The laser system of claim 19 wherein the magnifying system is formed of lenses arranged as an afocal telescope with a selected magnification factor.

22. The laser system of claim 21 wherein the magnification factor is equal to about four.

23. The laser system of claim 19 further including a polarization rotation element in the beam path from the collimating element to the diffraction grating, the polarization rotation element oriented such that the light on the beam path passed there-through to the diffraction grating is oriented with respect to the diffraction grating to provide a selected efficiency of the diffraction grating and to select the amount of light directed back by the diffraction grating toward the laser diode array to provide effective feedback without damaging the laser diode array.

24. The laser system of claim 23 wherein the polarization rotation element is mounted for rotation about an axis parallel with the output beam from the collimating element to allow rotation of the polarization rotation element to select the amount of feedback to the laser diode.

25. The laser system of claim 24 wherein the polarization rotation element is a half wave plate.

26. The laser system of claim 19 wherein the polarization rotation element is a half wave plate.

27. The laser system of claim 19 wherein a portion of the beam incident on the diffraction grating is directed by the diffraction grating to provide a useable output light beam from the laser system.

28. The laser system of claim 19 including a beam splitter in the beam path between the collimating element and the diffraction grating, the beam splitter partially reflecting the light from the array to provide a useable output beam from the system and partially passing the light therethrough to the diffraction grating and thence back again to be focussed onto the emitters in the diode laser array.

29. A method of narrowing the spectral width of the output of a high power diode laser array comprising multiple laser diode emitters arranged in approximately a straight line, comprising:
   (a) receiving the output of the diode laser array with a collimating element to provide a collimated output beam wherein the light is collimated in a direction perpendicular to the direction of the length of the array of emitters;
   (b) directing the collimated output beam to a diffraction grating mounted to receive the collimated beam from the collimating element on a beam path, reflecting light from the diffraction grating by a mirror back to the diffraction grating, magnifying the collimated light in the beam from the collimating element, and imaging the dimension of the array along the length of the array onto the mirror, and directing a portion of the beam from the grating back on the beam path to the collimating element and focusing the beam on the laser diode array emitters to provide feedback thereto to narrow the spectral range of the laser light output.

30. The method of claim 29 further including selecting the amount of light directed back by the diffraction grating to the laser diode array emitters to provide effective feedback without damaging the laser diode by passing the light on the beam path through a polarization rotation element.

31. The method of claim 30 further including rotating the polarization rotation element about an axis parallel with the beam from the collimating element to select the amount of feedback to the laser diode array emitters.

32. The method of claim 31 wherein the polarization rotation element through which the light is passed is a half wave plate.

33. The method of claim 29 further including the step of passing the output light beam from the diffraction grating into a cell containing a gas sample to laser polarize the gas.

34. The method of claim 33 wherein the gas is selected from the group consisting of xenon, helium, mixtures of xenon and rubidium, mixtures of helium and rubidium, mixtures of cesium and xenon, and mixtures of potassium and helium.

35. The method of claim 29 wherein the step of magnifying the light in the collimated output beam includes passing the beam through an afocal magnifying system.

36. The method of claim 29 including directing a portion of the beam from the diffraction grating to provide a useable output light beam.

* * * * *